(12) United States Patent
Kashimura et al.

(10) Patent No.: US 9,475,282 B2
(45) Date of Patent: *Oct. 25, 2016

(54) LIQUID EJECTING APPARATUS AND HEAD UNIT

(71) Applicant: Seiko Epson Corporation, Tokyo (JP)

(72) Inventors: Toru Kashimura, Shiojiri (JP); Hiroshi Sugita, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/459,725

(22) Filed: Aug. 14, 2014

(65) Prior Publication Data

US 2015/0062214 A1 Mar. 5, 2015

(30) Foreign Application Priority Data

Aug. 30, 2013 (JP) ................................. 2013-178971

(51) Int. Cl.
*B41J 2/045* (2006.01)
*B41J 2/155* (2006.01)
*B41J 2/16* (2006.01)

(52) U.S. Cl.
CPC .......... *B41J 2/04541* (2013.01); *B41J 2/0459* (2013.01); *B41J 2/04581* (2013.01); *B41J 2/04591* (2013.01); *B41J 2/04593* (2013.01); *B41J 2/155* (2013.01); *B41J 2/1612* (2013.01); *B41J 2202/03* (2013.01)

(58) Field of Classification Search
CPC ........................ H01F 17/04; H01F 2017/0053
See application file for complete search history.

(56) References Cited

U.S. PATENT DOCUMENTS

| | | | |
|---|---|---|---|
| 2,220,126 A * | 11/1940 | Holst | 336/178 |
| 3,855,561 A * | 12/1974 | Gottschalt | H01F 17/0006 336/134 |
| 8,382,224 B2 | 2/2013 | Tabata et al. | |
| 8,632,148 B2 | 1/2014 | Tabata et al. | |
| 9,254,645 B2 * | 2/2016 | Kashimura | B41J 2/0459 |
| 2002/0056186 A1 * | 5/2002 | De Graaf | H01F 3/14 29/606 |
| 2002/0067129 A1 | 6/2002 | Chamberlain et al. | |

(Continued)

FOREIGN PATENT DOCUMENTS

| | | |
|---|---|---|
| JP | 2010-114711 A | 5/2010 |
| JP | 2011-005733 A | 1/2011 |
| JP | 2013-038458 A | 2/2013 |

OTHER PUBLICATIONS

"First Edition Chapter 13. Filter inductor design" obtained from http://ecee.colorado.edu/copec/book/slides/Ch13slide.pdf; Last updated Aug. 20, 2004.*

*Primary Examiner* — Shelby Fidler
(74) *Attorney, Agent, or Firm* — Harness, Dickey & Pierce, P.L.C.

(57) ABSTRACT

A liquid ejecting apparatus includes a signal modulation section that causes an original drive signal to be pulse-modulated to generate a modulation signal, a signal amplification section that amplifies the modulation signal to generate an amplification modulation signal, a coil that smooths the amplification modulation signal to generate a drive signal, a piezoelectric element that deforms when the drive signal is applied thereto, a cavity that expands or contracts due to a deformation of the piezoelectric element, and a nozzle that communicates with the cavity and ejects a liquid in accordance with an increase/decrease of a pressure inside the cavity. The coil is a ferrite core-type coil, and a core gap is provided to be equal to or wider than 1.1 mm.

7 Claims, 13 Drawing Sheets

(56) References Cited

U.S. PATENT DOCUMENTS

| | | | |
|---|---|---|---|
| 2002/0093409 A1* | 7/2002 | Fujiwara | H01F 1/0558 336/178 |
| 2003/0059365 A1* | 3/2003 | Ito et al. | 423/594 |
| 2006/0055487 A1 | 3/2006 | Kobayashi et al. | |
| 2008/0192960 A1* | 8/2008 | Nussbaum et al. | 381/120 |
| 2012/0182339 A1* | 7/2012 | Oshima et al. | 347/10 |
| 2013/0187966 A1* | 7/2013 | Abe | 347/11 |

* cited by examiner

LIQUID EJECTING APPARATUS AND HEAD UNIT

The entire disclosure of Japanese Patent Application No. 2013-178971, filed Aug. 30, 2013 is expressly incorporated by reference herein.

BACKGROUND

1. Technical Field

The present invention relates to a liquid ejecting apparatus and a head unit which apply a drive signal to an actuator to eject a liquid. For example, the invention is suitable for a liquid ejecting-type printing apparatus which ejects a minute liquid from a nozzle of a liquid ejecting head and forms a minute particle (dot) on a printing medium, thereby printing a predetermined character or an image.

2. Related Art

As an example of a liquid ejecting apparatus, there is a known ink jet printer which ejects an ink (liquid) toward a recording medium from a nozzle provided in a head. Generally, a nozzle row having multiple nozzles arranged in a predetermined direction is formed in the head, for example, there is a known serial head method in which the head relatively moves in a direction in which a scanning direction of the head intersects a transportation direction of the recording medium and ejects an ink to print an image in a width of the nozzle row. As disclosed in JPA-2011-5733, there is also a known line head method in which nozzles are disposed in a row shape in a direction intersecting a transportation direction of a recording medium and an image is printed when the recording medium passes therebelow.

JP-A-2011-5733 discloses an exemplification in which a secondary filter consisting of one capacitor C and a coil L is used as a smooth filter, without specifying which type of the coil L needs to be used.

A coil used in smoothing an amplification modulation signal from a digital power amplification circuit generally tends to be great in heat generation and a loss, and thus, selection of a coil which can prevent heat generation and heat loss from occurring is a major disadvantage in designing a liquid ejecting-type printing apparatus. Particularly, in a printer, since an amplification modulation signal at a high frequency such as a MHz order is used in order to obtain a printed matter having sufficient quality and resolution, it is difficult to use a method of selecting a coil adopted in other electronic apparatuses (for example, an ordinary audio apparatus uses a frequency of approximately 32 kHz to 400 kHz) in a printer as it is.

SUMMARY

An advantage of some aspects of the present invention is to provide a liquid ejecting-type printing apparatus of low power consumption or a head unit used in the same apparatus able to select the coil having high conversion efficiency which can prevent heat generation and heat loss from occurring when smoothing the amplification modulation signal, for example, in the liquid ejecting-type printing apparatus such as an ink jet printer using the amplification modulation signal at a high frequency.

(1) According to an aspect of the invention, there is provided a liquid ejecting apparatus including a signal modulation section that causes an original drive signal to be pulse-modulated to generate a modulation signal, a signal amplification section that amplifies the modulation signal to generate an amplification modulation signal, a coil that smooths the amplification modulation signal to generate a drive signal, a piezoelectric element that deforms when the drive signal is applied thereto, a cavity that expands or contracts due to deformation of the piezoelectric element, and a nozzle that communicates with the cavity and ejects a liquid in accordance with the increase/decrease of a pressure inside the cavity. The coil is a ferrite core-type, and a core gap therein is provided to be equal to or wider than 1.1 mm.

In the liquid ejecting apparatus, the amplification modulation signal at a high frequency generated in the signal amplification section (for example, digital power amplification circuit) is input to the coil. For this reason, an iron loss (loss of core material) is often more dominant than a copper loss (loss of wire material) as a factor increasing heat generation during power consumption. An eddy-current loss accounting for a large portion of the iron loss is proportional to square of magnetic flux density, and thus, it is possible to lower the magnetic flux density and further prevent the iron loss by providing the core gap of the coil to be equal to or wider than 1.1 mm. Therefore, since the coil which can attain high conversion efficiency is used without increasing heat generation or power consumption, it is possible to realize low power consumption in the liquid ejecting apparatus according to the aspect of the invention.

The original drive signal indicates an original signal of a drive signal which controls deformation of a piezoelectric element, that is, a signal before being modulated which becomes a reference of a waveform. The modulation signal indicates a digital signal which can be obtained by causing the original drive signal to be pulse-modulated (for example, pulse width modulation, pulse density modulation and the like), and the signal modulation section indicates a modulation circuit performing the pulse modulation. The signal amplification section indicates a digital power amplification circuit including a half bridge output stage, for example, and the amplification modulation signal indicates a modulation signal amplified in the signal amplification section. The drive signal indicates a signal which can be obtained by smoothing the amplification modulation signal using a coil, and the drive signal is applied to the piezoelectric element.

(2) The coil may have the number of turn equal to or greater than three.

In the liquid ejecting apparatus according to the invention, the coil can maintain an inductance value even though the core gap is widened, by having the number of turn equal to or greater than three. Accordingly, even though the core gap of the coil is widened, there is no need to change design of a filter in which the coil is used, for example, and thus, it is possible to easily realize a liquid ejecting apparatus of low power consumption.

(3) A frequency band of an AC component of the amplification modulation signal may be equal to or higher than 1 MHz.

In the liquid ejecting apparatus according to the invention, the amplification modulation signal is smoothed to generate the drive signal, and a liquid is ejected from the nozzle based on deformation of the piezoelectric element to which the drive signal is applied. According to a frequency spectrum analysis performed upon a waveform of the drive signal for the liquid ejecting apparatus ejecting small dots (minute dots), it has been learned that a frequency component equal to or lower than 50 kHz is included. In order to amplify an original drive signal including this frequency component of 50 kHz through the digital power amplification circuit (corresponding to signal amplification section), a modulation signal (amplification modulation signal) including a frequency component equal to or higher than 1 MHz is needed. If reproducing of the original drive signal is attempted with only the frequency component equal to or lower than 1 MHz, the edge of the waveform becomes obtuse and rounded. In other words, sharpness disappears and the waveform becomes obtuse. If the waveform of the drive signal becomes obtuse, movements of the piezoelectric element which is operated in accordance with the rising edge/falling edge of the waveform become dull, thereby causing an occurrence of unstable driving such as tailing or ejection failure during ejection. The liquid ejecting apparatus of the invention has the frequency band of an AC component of the amplification modulation signal equal to or higher than 1 MHz so that there is no unstable driving such as the tailing or the ejection failure during ejection, thereby making it possible to realize the liquid ejecting apparatus which can obtain a product having high resolution.

(4) The frequency band of an AC component of the amplification modulation signal may be lower than 8 MHz.

If a high frequency equal to or higher than 8 MHz is supported as a frequency of the amplification modulation signal, resolving power of the waveform of the drive signal is enhanced, but a switching frequency in the digital power amplification circuit (corresponding to signal amplification section) rises in accordance with improvement in the resolving power. If the switching frequency rises, a switching loss becomes significant, resulting in impairment of a power saving property and a low pyrogenic property in which a digital amplifier is relatively advantageous compared to an amplifier of class AB. Thus, it may be desirable to perform amplification by using the amplifier of class AB. In the liquid ejecting apparatus of the invention, the frequency band of the AC component of the amplification modulation signal is caused to be lower than 8 MHz, and it is possible to maintain advantages of low power consumption and low heat generation compared to a case using the amplifier of class AB.

(5) A loss of a core material may be greater than a loss of a wire material in the coil during a normal operation.

The normal operation denotes a state where the liquid ejecting apparatus is used for a normal purpose and a product can be obtained by ejecting a liquid thereof. In this case, an amplification modulation signal within a predetermined frequency band (for example, 1 MHz to 8 MHz) is input to the coil of the liquid ejecting apparatus according to the present embodiment. In the coil of the liquid ejecting apparatus of an embodiment, the iron loss (loss of core material) is greater than the copper loss (loss of wire material) with respect to the overall frequencies. In the coil of the liquid ejecting apparatus according to the embodiment, it is possible to particularly prevent the iron loss which is dominant during the normal operation by providing the core gap equal to or wider than 1.1 mm. Therefore, it is possible to realize low power consumption in the liquid ejecting apparatus of the invention.

(6) The core material of the coil may be formed of Mn—Zn-based ferrite.

In the liquid ejecting apparatus according to the invention, the coil having a core material formed of the Mn—Zn-based ferrite in which a resistance component (below-described Rs) is greater compared to a coil of another type is used, and thus, it is possible to prevent the eddy-current loss from accounting for a large portion of the iron loss. Therefore, since the coil which can acquire the high conversion efficiency is used without increasing heat generation or power consumption, it is possible to realize low power consumption all the more in the liquid ejecting apparatus of the invention.

(7) According to another aspect of the invention, there is provided a head unit including a piezoelectric element that deforms when a drive signal is applied thereto, a cavity that expands or contracts due to deformation of the piezoelectric element, and a nozzle that communicates with the cavity and ejects a liquid in accordance with the increase/decrease of a pressure inside the cavity. The drive signal generated by smoothing an amplification modulation signal is applied to the piezoelectric element through a ferrite-type coil which is provided with a core gap equal to or wider than 1.1 mm.

In the head unit, there is provided the piezoelectric element to which the drive signal generated by the coil provided with the core gap equal to or wider than 1.1 mm is applied. Therefore, since the liquid ejecting apparatus including this head unit uses the coil which can acquire the high conversion efficiency without increasing heat generation or power consumption by preventing the iron loss, it is possible to realize low power consumption.

BRIEF DESCRIPTION OF THE DRAWINGS

The invention will be described with reference to the accompanying drawings, wherein like numbers reference like elements.

FIG. 8 is a detailed block diagram of the drive signal generation section and the like.

DESCRIPTION OF EXEMPLARY EMBODIMENTS

1. Configuration of Printing System

A configuration applied to a liquid ejecting-type printing apparatus will be described as an embodiment of a liquid ejecting apparatus according to the invention.

Figure 1:
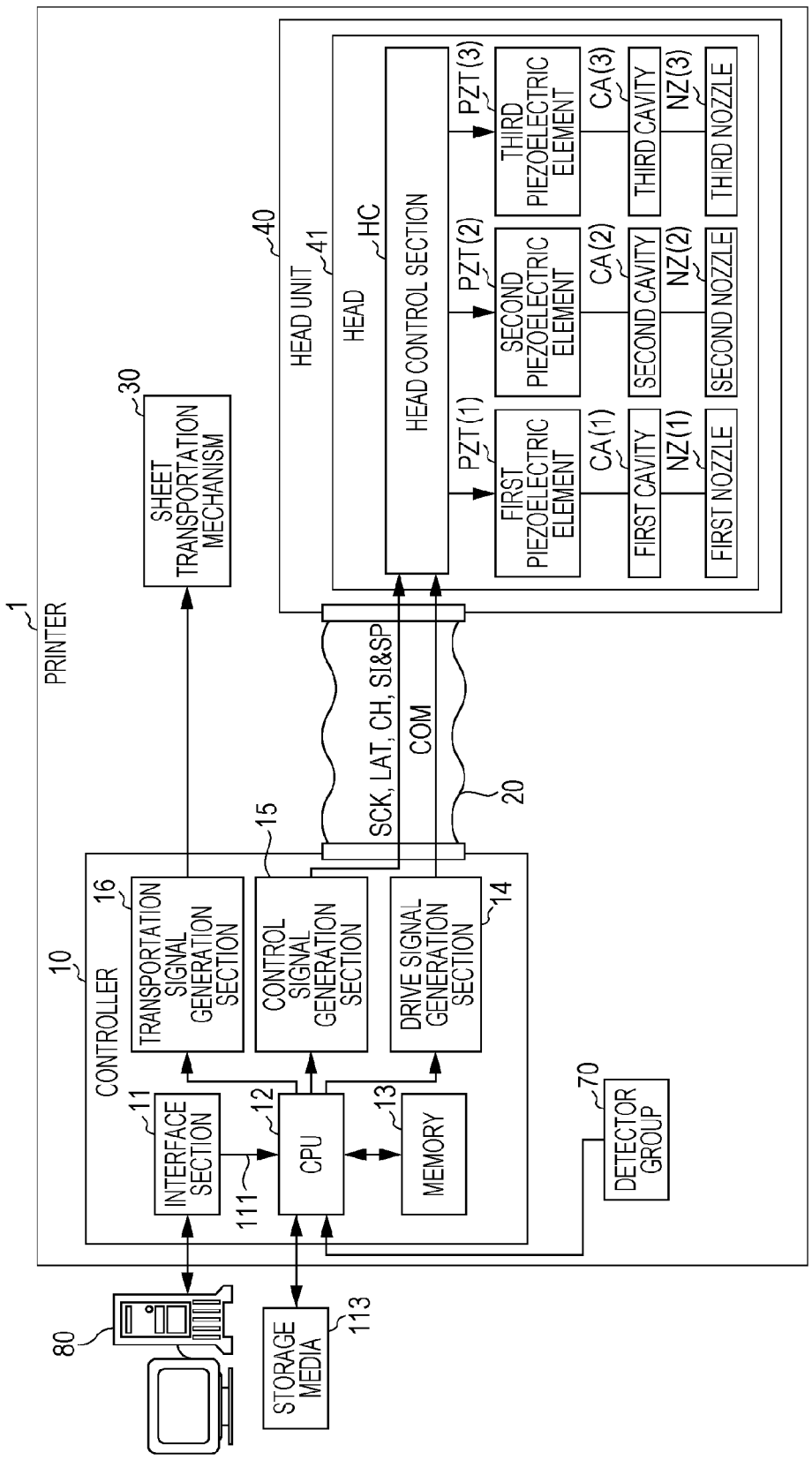
FIG. 1 is a block diagram illustrating an overall configuration of a printing system.

FIG. 1 is a block diagram illustrating an overall configuration of a printing system including a liquid ejecting-type printing apparatus (printer 1) of the present embodiment. As described below, the printer 1 is a line head printer in which a sheet S (refer to FIGS. 2 and 3) is transported in a predetermined direction and is printed in a printing region during the transportation thereof.

The printer 1 is connected to a computer 80 to be able to communicate with each other. A printer driver installed inside the computer 80 creates printing data to cause the printer 1 to print an image, and outputs the data to the printer 1. The printer 1 has a controller 10, a sheet transportation mechanism 30, a head unit 40 and a detector group 70. As described below, the printer 1 may include a plurality of head units 40. However, one head unit 40 will be described herein as a representative unit illustrated in FIG. 1.

The controller 10 inside the printer 1 performs overall controlling in the printer 1. An interface section 11 transceiver data with respect to the computer 80, which is an external apparatus. The interface section 11 outputs a piece of printing data 111 among pieces of data received from the computer 80 to a CPU 12. The printing data 111 includes image data, data designating a printing mode, and the like.

The CPU 12 is an arithmetic processing unit performing the overall controlling of the printer 1 and controls the head unit 40 and the sheet transportation mechanism 30 via a drive signal generation section 14, a control signal generation section 15 and a transportation signal generation section 16. A memory 13 secures a storage region or a working region for a program and data of the CPU 12. The detector group 70 monitors circumstances in the printer 1, and the controller 10 performs the controlling based on a detected result from the detector group 70. The program and the data of the CPU 12 may be stored in a storage medium 113. The storage medium 113 may be any one of a magnetic disk such as a hard disk, an optical disk such as a DVD, a nonvolatile memory such as a flash memory, and the like, without being particularly limited. As in FIG. 1, the CPU 12 may be accessible to the storage medium 113 which is connected to the printer 1. The storage medium 113 may be connected to the computer 80, and the CPU 12 may be accessible (route not illustrated) to the storage medium 113 via the interface section 11 and the computer 80.

The drive signal generation section 14 generates a drive signal COM displacing a piezoelectric element PZT which is included in a head 41. As described below, the drive signal generation section 14 includes a portion of an original drive signal generation section 25, a signal modulation section 26, a signal amplification section 28 (digital power amplification circuit), and a signal conversion section 29 (smooth filter) (refer to FIG. 7). The drive signal generation section 14 following instructions from the CPU 12 generates an original drive signal 125 in the original drive signal generation section 25, causes the original drive signal 125 to be pulse-modulated in the signal modulation section 26 to generate a modulation signal 126, amplifies the modulation signal 126 in the signal amplification section 28, and smooths an amplification modulation signal 128 (amplified modulation signal 126) in the signal conversion section 29, thereby generating the drive signal COM.

The control signal generation section 15 following instructions from the CPU 12 generates a control signal. The control signal is a signal used for controlling the head 41, selecting a nozzle to eject a liquid, for example. In the embodiment, the control signal generation section 15 generates control signals including a clock signal SCK, a latch signal LAT, a channel signal CH and drive pulse selection data SI & SP, and these signals will be described below in detail. The control signal generation section 15 may be configured to be included in the CPU 12 (that is, a configuration in which the CPU 12 also performs a function of the control signal generation section 15).

The drive signal COM generated by the drive signal generation section 14 is an analog signal in which a voltage continuously changes. The control signals including the clock signal SCK, the latch signal LAT, the channel signal CH and the drive pulse selection data SI & SP are digital signals. The drive signal COM and the control signals are transmitted to the head 41 of the head unit 40 via a cable 20, that is, a flexible flat cable (hereinafter, also referred to as FFC). Regarding the control signal, a differential serial method may be used to transmit a plurality of types of the signals through time sharing. In this case, compared to a case of parallel transmission of the control signals classified by types, the number of transmission wire necessary can be reduced, thereby avoiding deterioration of a sliding property caused by many superposed FFC and causing a size of a connector provided in the controller 10 and the head unit 40 to be small.

The transportation signal generation section 16 following the instructions from the CPU 12 generates a signal to control the sheet transportation mechanism 30. The sheet transportation mechanism 30 rotatably supports the sheet S which is continuously wound in a roll shape, for example, and transports the sheet S by rotating, thereby printing a predetermined character, image or the like in the printing region. For example, the sheet transportation mechanism 30 transports the sheet S in a predetermined direction based on a signal generated in the transportation signal generation section 16. The transportation signal generation section 16 may be configured to be included in the CPU 12 (that is, a configuration in which the CPU 12 also performs a function of the transportation signal generation section 16).

The head unit 40 includes the head 41 as a liquid ejecting section. Due to limitations of space, only one head 41 is illustrated in FIG. 1. However, the head unit 40 according to the embodiment is regarded as having a plurality of heads 41. The head 41 has at least two actuator sections including the piezoelectric element PZT, a cavity CA and a nozzle NZ, and also includes a head control section HC controlling displacement of the piezoelectric element PZT. The actuator section includes the piezoelectric element PZT which is displaceable by the drive signal COM, the cavity CA which is filled with a liquid and in which an inside pressure is increased/decreased in accordance with the displacement of the piezoelectric element PZT, and a nozzle NZ which communicates with the cavity CA and ejects a liquid as a liquid droplet in accordance with the increase/decrease of a pressure inside the cavity CA. The head control section HC controls the displacement of the piezoelectric element PZT based on the drive signal COM and the control signal from the controller 10.

In order to distinguish elements included in each actuator section, a numeral in parenthesis is applied to the reference sign. In the example of FIG. 1, there are three actuator sections. A first actuator section includes a first piezoelectric element PZT(1), a first cavity CA(1) and a first nozzle NZ(1); a second actuator section includes a second piezoelectric element PZT(2), a second cavity CA(2) and a second nozzle NZ(2); and a third actuator section includes a third piezoelectric element PZT(3), a third cavity CA(3) and a third nozzle NZ(3). The actuator section may be two or four in number, for example, without being limited to being three. In FIG. 1, the first to third actuator sections are included in one head 41 for convenience of illustration. However, a portion of the actuators may be included in another head 41 (not illustrated).

The drive signal COM is generated in the drive signal generation section 14 as in FIG. 1, and transmitted to the first piezoelectric element PZT(1), the second piezoelectric element PZT(2) and the third piezoelectric element PZT(3) via the cable 20 and the head control section HC. The control signals including the clock signal SCK, the latch signal LAT, the channel signal CH and the drive pulse selection data SI & SP are generated in the control signal generation section 15 as in FIG. 1, and used for controlling in the head control section HC via the cable 20.

2. Configuration of Printer

Figure 2:
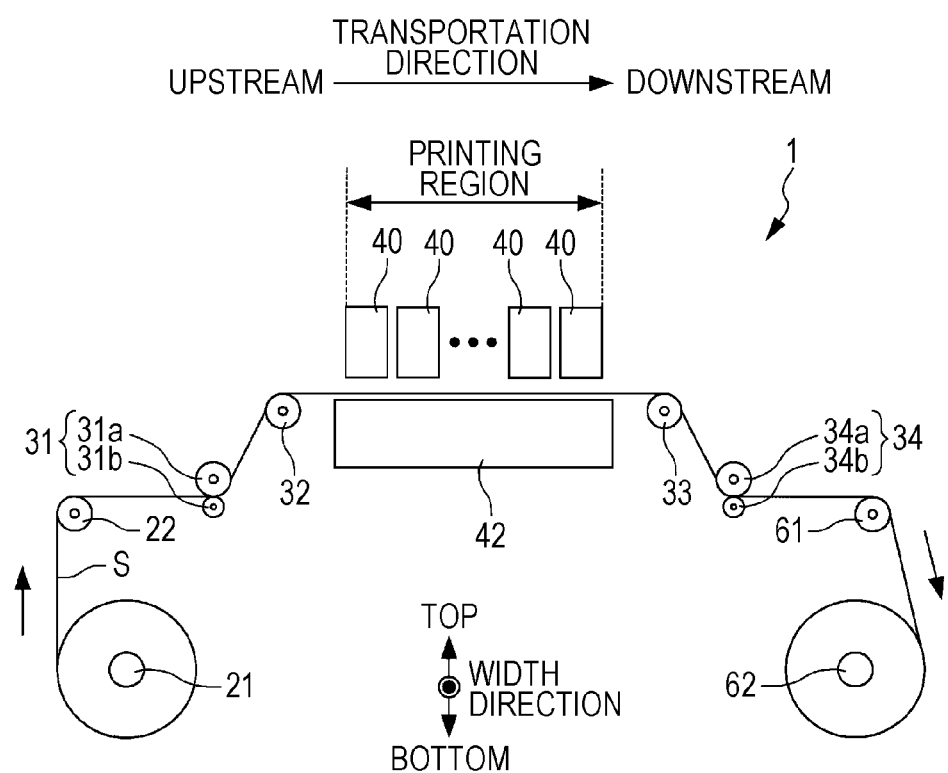
FIG. 2 is a schematic cross-sectional view of a printer.

FIG. 2 is a schematic cross-sectional view of the printer 1. In the example of FIG. 2, the sheet S is described as continuously wound paper in a roll shape. A recording medium on which the printer 1 prints an image may be cut paper, cloth, a film or the like, without being limited to the continuously wound paper.

The printer 1 has a feeding shaft 21 which feeds the sheet S by rotating, and a relay roller 22 which winds the sheet S fed from the feeding shaft 21 to be guided to a pair of upstream side transportation rollers 31. The printer 1 has a plurality of relay rollers 32 and 33 which wind and send the sheet S, the pair of upstream side transportation rollers 31 which are installed on an upstream side from the printing region in a transportation direction, and a pair of downstream side transportation rollers 34 which are installed on a downstream side from the printing region in the transportation direction. The pair of upstream side transportation rollers 31 and the pair of downstream side transportation rollers 34 respectively have driving rollers 31a and 34a connected to motors (not illustrated) for rotational driving, and driven rollers 31b and 34b rotating in accordance with rotations of the driving rollers 31a and 34a. A transportation force is applied to the sheet S in accordance with the rotational driving of the driving rollers 31a and 34a in a state where the pair of upstream side transportation rollers 31 and the pair of downstream side transportation rollers 34 respectively pinch the sheet S. The printer 1 has a relay roller 61 which winds and sends the sheet S sent from the pair of downstream side transportation rollers 34, and a winding driving shaft 62 which winds the sheet S sent from the relay roller 61. The printed sheet S is sequentially wound in a roll shape in accordance with the rotational driving of the winding driving shaft 62. The rollers or the motors (not illustrated) correspond to the sheet transportation mechanism 30 in FIG. 1.

The printer 1 has the head unit 40 and a platen 42 which supports the sheet S from an opposite side surface of a printing surface in the printing region. The printer 1 may include the plurality of head units 40. In the printer 1, for example, the head unit 40 may be prepared for each color of ink. The printer 1 may have a configuration in which four head units 40 which can eject inks in four colors, that is, yellow (Y), magenta (M), cyan (C) and black (K) are arranged in the transportation direction. In the description below, one head unit 40 is described as a representative unit. However, the colors of the ink are respectively allocated to the nozzles thereof, thereby making it possible to perform color printing.

Figure 3:
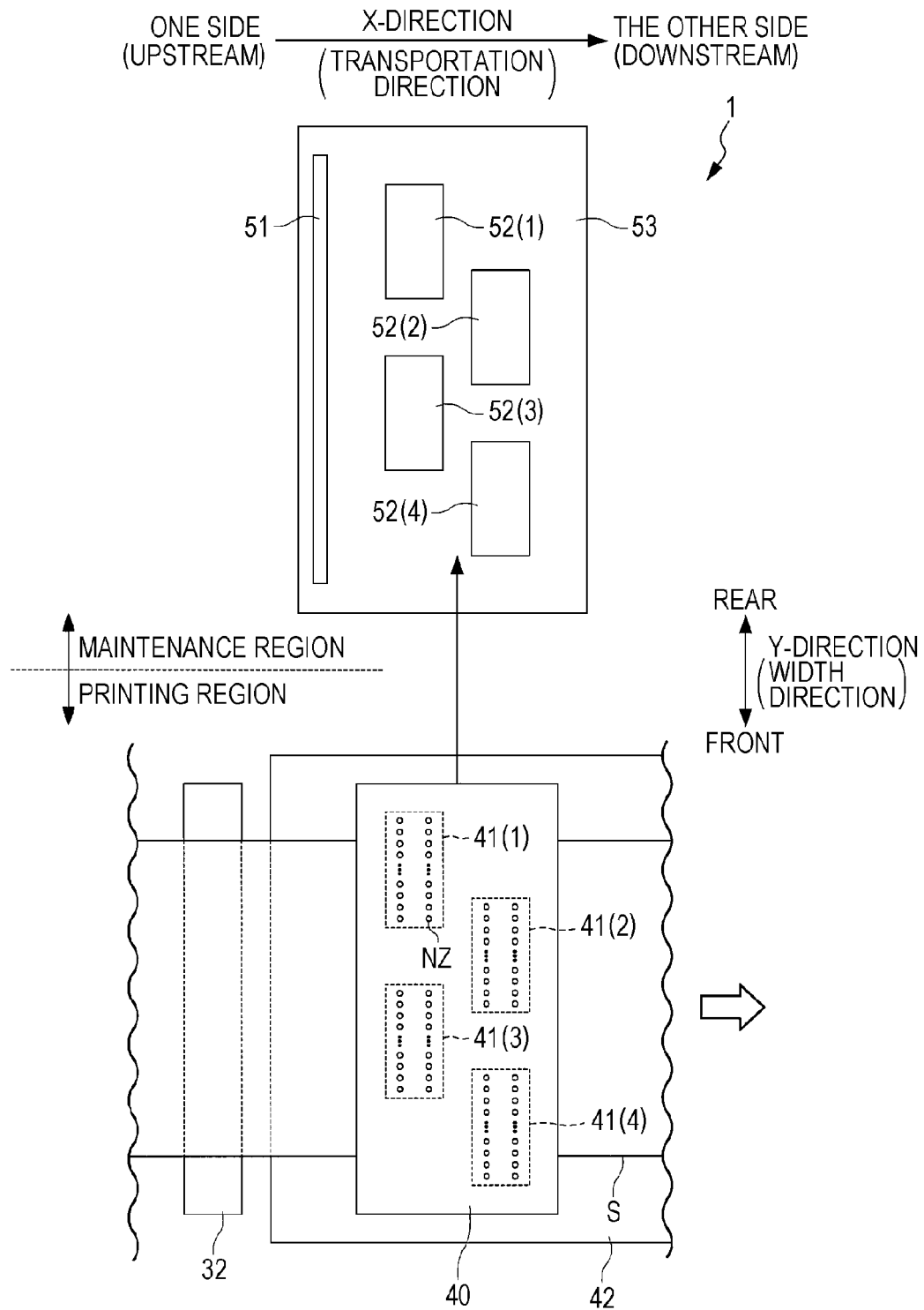
FIG. 3 is a schematic top view of the printer.

As illustrated in FIG. 3, in the head unit 40, a plurality of heads 41(1) to 41(4) are arranged in a width direction (Y-direction) of the sheet S intersecting with the transportation direction of the sheet S. For convenience of description, numbers are applied in an ascending order from the head 41 on a further rear side in the Y-direction. On a surface facing the sheet S (bottom surface) in each head 41, multiple nozzles NZ ejecting an ink are arranged at predetermined intervals in the Y-direction. FIG. 3 virtually illustrates positions of the heads 41 and the nozzles NZ when the head unit 40 is seen from the top. The positions of the nozzles NZ in end portions of the heads 41 adjacent to each other in the Y-direction (for example, 41(1) and 41(2)) overlap each other at least in a portion, and the nozzles NZ are arranged at predetermined intervals in the Y-direction across a length equal to or wider than the width of the sheet S on the bottom surface of the head unit 40. Therefore, the head unit 40 ejects an ink from the nozzle NZ to the sheet S which is transported under the head unit 40 without stopping, thereby printing a two-dimensional image on the sheet S.

In FIG. 3, due to limitations of space, the heads 41 which belong to the head unit 40 are illustrated as four, but the number is not limited thereto. In other words, the number of head 41 may be more or less than four. The heads 41 in FIG. 3 are disposed in a zigzag grid shape, but the disposition is not limited thereto. As a method of ejecting an ink from the nozzle NZ, a piezoelectric type is adopted in the embodiment in which an ink is ejected by applying a voltage to the piezoelectric element PZT to expand/extract an ink chamber. However, a thermal type may be adopted in which an ink is ejected by air bubbles generated inside the nozzle NZ using a heating element.

In the embodiment, the sheet S is supported on a horizontal surface of the platen 42, but without being limited thereto, for example, a rotation drum which rotates around a rotating shaft in the width direction of the sheet S may be caused to serve as the platen 42, thereby ejecting an ink from the head 41 while winding the sheet S around the rotation drum to be transported. In this case, the head unit 40 is obliquely disposed along an outer circumferential surface of an arc shape of the rotation drum. If the ink ejected from the head 41 is an UV ink which is cured by irradiating ultraviolet rays, an irradiator for irradiating ultraviolet rays may be provided on a downstream side of the head unit 40.

The printer 1 is provided with a maintenance region for cleaning the head unit 40. There exist a wiper 51, a plurality of caps 52 and an ink reception section 53 in the maintenance region of the printer 1. The maintenance region is positioned on a rear side in the Y-direction from the platen 42 (that is, printing region), and the head unit 40 moves to the rear side in the Y-direction while cleaning.

The wiper 51 and the caps 52 are supported by the ink reception section 53 to be movable in an X-direction (transportation direction of sheet S) by the ink reception section 53. The wiper 51 is a plate-shaped member erected in the ink reception section 53 and formed of an elastic member, cloth, felt and the like. The caps 52 are rectangular parallelepiped members formed of the elastic members and the like, and are provided in each head 41. The caps 52(1) to 52(4) are arranged in the width direction corresponding to the disposition of the heads 41(1) to 41(4) in the head unit 40. Accordingly, if the head unit 40 moves to the rear side in the Y-direction, the heads 41 and the caps 52 face each other, and then, if the head unit 40 is lowered (or if the caps 52 are lifted), the caps 52 respectively adhere to nozzle opening surfaces of the heads 41, thereby making it possible to seal the nozzle NZ. The ink reception section 53 also functions to receive an ink ejected from the nozzles NZ while cleaning the heads 41.

When an ink is ejected from the nozzle NZ provided in the heads 41, minute ink droplets are generated together with main ink droplets, and the minute ink droplets fly about as a mist, thereby adhering to the nozzle opening surfaces of the heads 41. Not only the ink, but dust, paper powder and the like also adhere to the nozzle opening surfaces of the heads 41. If these foreign substances are left behind and accumulate and adhere to the nozzle opening surfaces of the heads 41, the nozzles NZ are blocked, thereby hindering ejection of ink from the nozzles NZ. Therefore, in the printer 1 according to the embodiment, a wiping treatment is periodically carried out as the cleaning of the head unit 40.

3. Drive Signal and Control Signal

Hereinafter, the drive signal COM and the control signal transmitted from the controller 10 via the cable 20 will be described in detail. Initially, a structure of the heads 41 will be described, and after waveforms of the drive signal COM and the control signal are exemplified, a configuration of the head control section HC will be described.

3.1. Structure of Head

Figure 4:
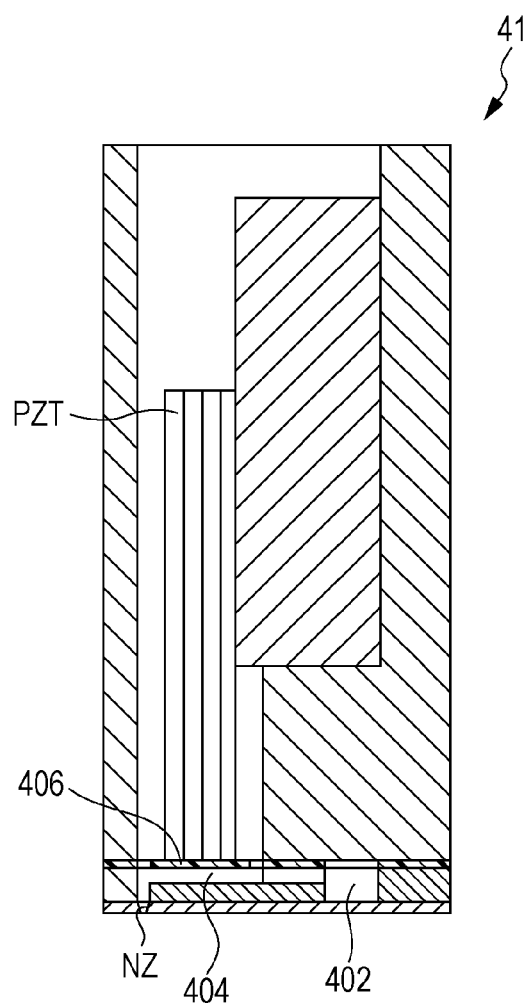
FIG. 4 is a view for describing a structure of a head.

FIG. 4 is a view for describing a structure of the head 41. The nozzle NZ, the piezoelectric element PZT, an ink supply channel 402, a nozzle communication channel 404 and an elastic plate 406 are illustrated in FIG. 4. The ink supply channel 402 and the nozzle communication channel 404 correspond to the cavity CA.

The ink droplets are supplied through the ink supply channel 402 from an ink tank (not illustrated). Then, the ink droplets are supplied to the nozzle communication channel 404. A drive pulse PCOM of the drive signal COM is applied to the piezoelectric element PZT. When the drive pulse PCOM is applied, the piezoelectric element PZT expands/extracts (is displaced) in accordance with a waveform, thereby vibrating the elastic plate 406. The ink droplets in an amount corresponding to amplitude of the drive pulse PCOM are ejected from the nozzle NZ. The actuator sections configured to have the nozzles NZ, the piezoelectric element PZT and the like are arranged as in FIG. 3, thereby configuring the heads 41 having the nozzle rows.

3.2. Waveform of Signal

Figure 5:
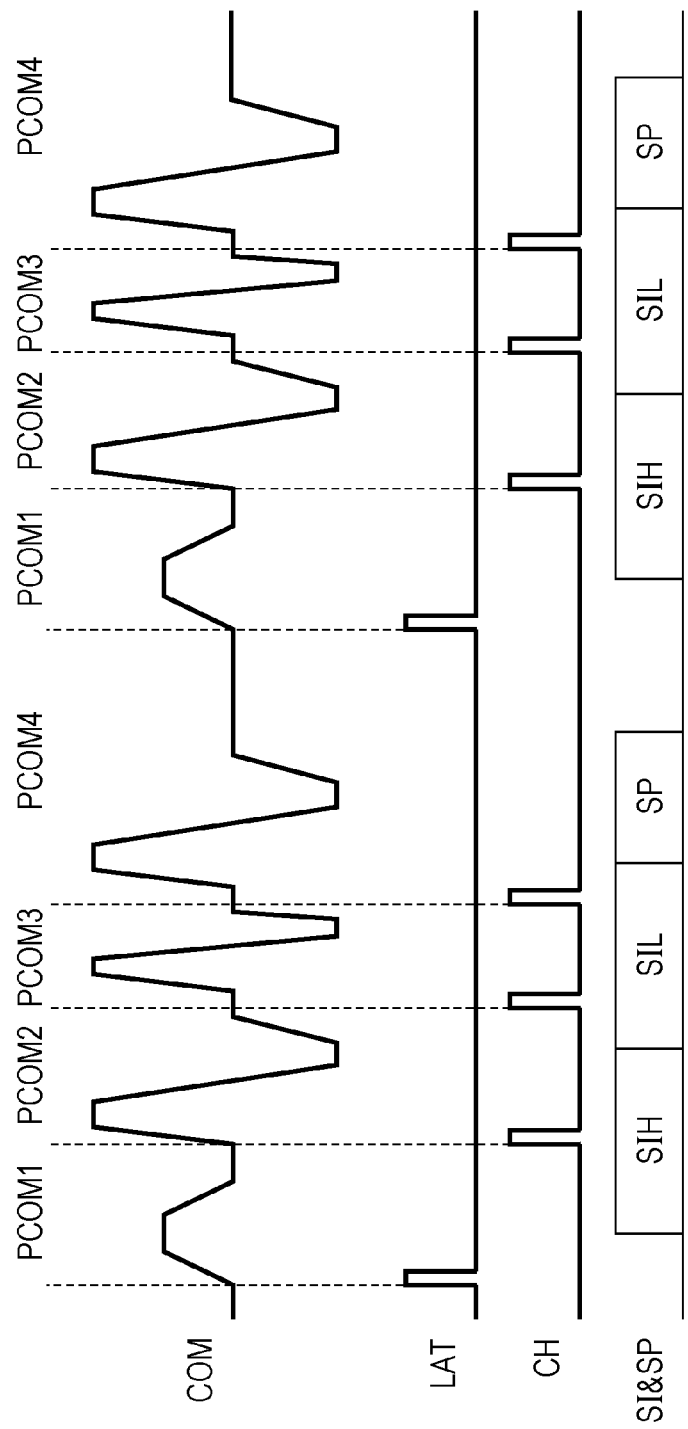
FIG. 5 is a view for describing a drive signal which is from a drive signal generation section, and a control signal which is used in forming dots.

FIG. 5 is a view for describing the drive signal COM which is from the drive signal generation section 14 and the control signal which is used in forming dots. The drive signal COM is obtained by chronologically connecting the drive pulses PCOM, that is, unit drive signals applied to the piezoelectric element PZT to eject a liquid. A rising portion of the drive pulse PCOM indicates a stage in which volume of the cavity CA communicating with the nozzle is expanded to draw a liquid in, and a falling portion of the drive pulse PCOM indicates a stage in which the volume of the cavity CA is contracted to push a liquid out. As a result of pushing out a liquid, the liquid is ejected from the nozzle.

A draw-in amount or a draw-in speed of a liquid and a push-out amount or a push-out speed of the liquid can vary by variously changing an inclination of increase/decrease in voltage and a peak value of the drive pulse PCOM formed by a voltage trapezoidal wave. Accordingly, it is possible to obtain the dot having various sizes by changing an ejecting amount of a liquid. Therefore, even in a case of chronologically connecting the plurality of drive pulses PCOM, it is possible to obtain the dots having various sizes by selecting a single drive pulse PCOM therefrom to be applied to the piezoelectric element PZT, thereby ejecting a liquid, or by selecting a plurality of the drive pulses PCOM to be applied to the piezoelectric element PZT, thereby ejecting a liquid a plurality of times. In other words, if a plurality of liquids are caused to impact onto the same position before the liquids dry, substantially the same effect can be achieved as ejecting a large amount of liquid, and thus, the dot can be increased in size. It is possible to achieve multi-gradation by combining such technologies. A drive pulse PCOM 1 at the left end in FIG. 5 only draws a liquid in without pushing any out, which is different from drive pulses PCOM 2 to PCOM 4. This is called a minute vibration and is used for suppressing and preventing thickening at the nozzle without ejecting an ink.

The clock signal SCK, the latch signal LAT, the channel signal CH and the drive pulse selection data SI & SP are input to the head control section HC as the control signals from the control signal generation section 15, in addition to the drive signal COM from the drive signal generation section 14. The latch signal LAT and the channel signal CH among these are the control signals determining an instant of time for the drive signal COM. As in FIG. 5, a series of drive signals COM begin to be output by the latch signal LAT so that a drive pulse PCOM is output for each channel signal CH. Pieces of the drive pulse selection data SI & SP include pieces of the pixel data SI (SIH, SIL) for designating the piezoelectric element PZT corresponding to the nozzle which is to eject an ink droplet, as well as a piece of waveform pattern data SP of the drive signal COM. The reference signs SIH and SIL respectively correspond to a high-order bit and a low-order bit of the 2-bit pixel data SI.

3.3. Head Control Section

Figure 6:
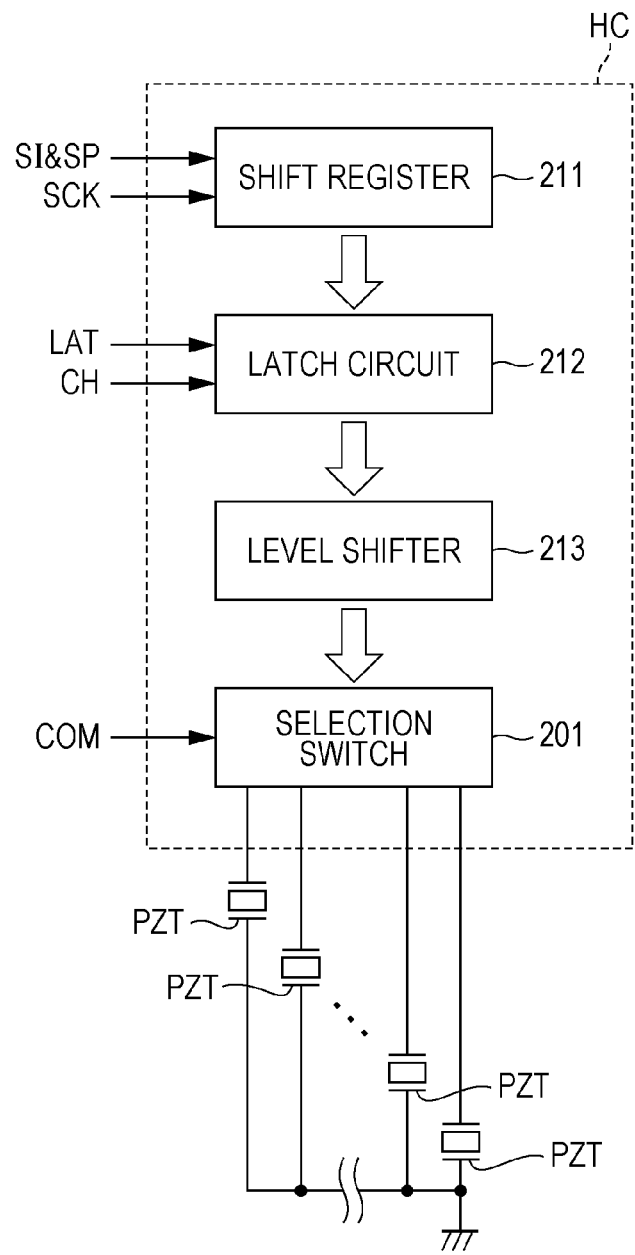
FIG. 6 is a block diagram describing a configuration of a head control section.

FIG. 6 is a block diagram describing a configuration of the head control section HC. The head control section HC is configured to have a shift register 211 which stores the drive pulse selection data SI & SP for designating the piezoelectric element PZT corresponding to the nozzle ejecting a liquid, a latch circuit 212 which temporarily stores data of the shift register 211, and a level shifter 213 which applies a voltage of the drive signal COM to the piezoelectric element PZT by converting a level of an output of the latch circuit 212 to supply to a selection switch 201.

The pieces of the drive pulse selection data SI & SP are sequentially input to the shift register 211, and a storage region is sequentially shifted from a first stage to latter stages in accordance with an input pulse of the clock signal SCK. The latch circuit 212 latches each output signal of the shift register 211 in response to the input latch signal LAT, after the pieces of the drive pulse selection data SI & SP are stored in the shift register 211 related to the corresponding the number of the nozzle. The signals stored in the latch circuit 212 are converted into a voltage level in which the selection switch 201 in a next stage can be turned on/off by the level shifter 213. This is because the drive signal COM is charged with a high voltage compared to an output voltage of the latch circuit 212 and a range of an operation voltage of the selection switch 201 is set high in accordance therewith. Therefore, the piezoelectric element PZT in which the selection switch 201 is closed by the level shifter 213 is connected to the drive signal COM (drive pulse PCOM) as a connection of the drive pulse selection data SI & SP.

After the drive pulse selection data SI & SP of the shift register 211 is stored in the latch circuit 212, subsequent printing information is input to the shift register 211, thereby sequentially updating the stored data of the latch circuit 212 during an ejection of a liquid. Even after causing the piezoelectric element PZT to be separated from the drive signal COM (drive pulse PCOM), this selection switch 201 allows the input voltage of the piezoelectric element PZT to maintain the voltage immediately before being separated therefrom.

3.4. Drive Signal

Figure 7:
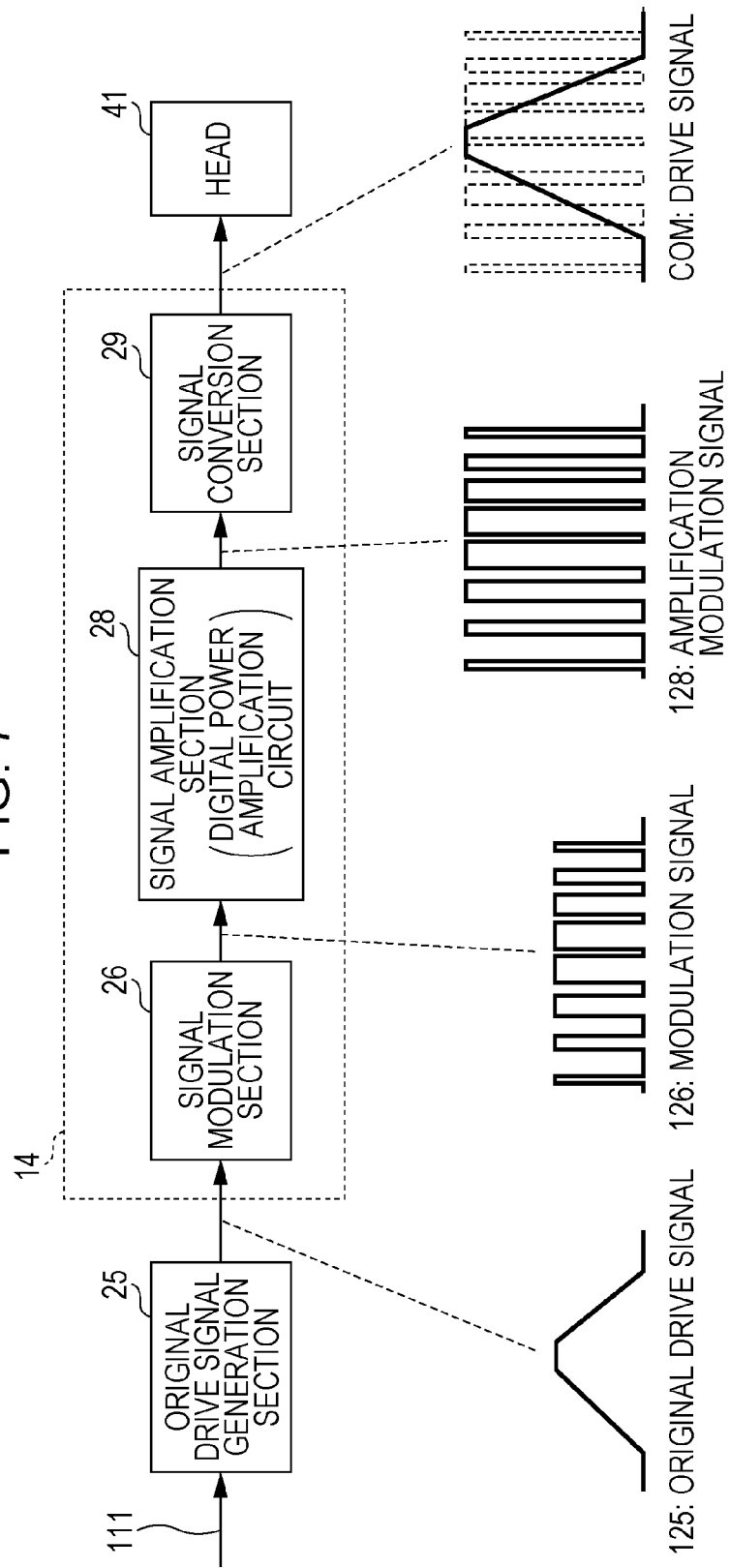
FIG. 7 is a view describing a flow up to generation of the drive signal.

FIG. 7 is a view describing a flow for explaining generation of the drive signal COM. As described above, the portion of the original drive signal generation section 25, the signal modulation section 26, the signal amplification section 28 (digital power amplification circuit), and the signal conversion section 29 (smooth filter) in FIG. 7 correspond to the drive signal generation section 14. The original drive signal generation section 25 generates the original drive signal 125 as in FIG. 7, for example, based on the printing data 111 from the interface section 11.

The original drive signal generation section 25 includes the CPU 12, a DAC 39 and the like as described below, and the CPU 12 selects original drive data based on the printing data 111 to output to the DAC 39, thereby generating the original drive signal 125.

The signal modulation section 26 performs a predetermined modulation to generate the modulation signal 126 upon the original drive signal 125 from the original drive signal generation section 25. As described below, a modulation using an error amplifier 37 is performed as the predetermined modulation in the embodiment. However, a basic modulation operation thereof is the same as that of a pulse-density modulation (PDM). Another modulation method such as a pulse-width modulation (PWM) may be used as the predetermined modulation.

The signal amplification section 28 receives the modulation signal 126 to perform power amplification, and the signal conversion section 29 smooths the amplification modulation signal 128 to generate the analog drive signal COM.

Figure 8:
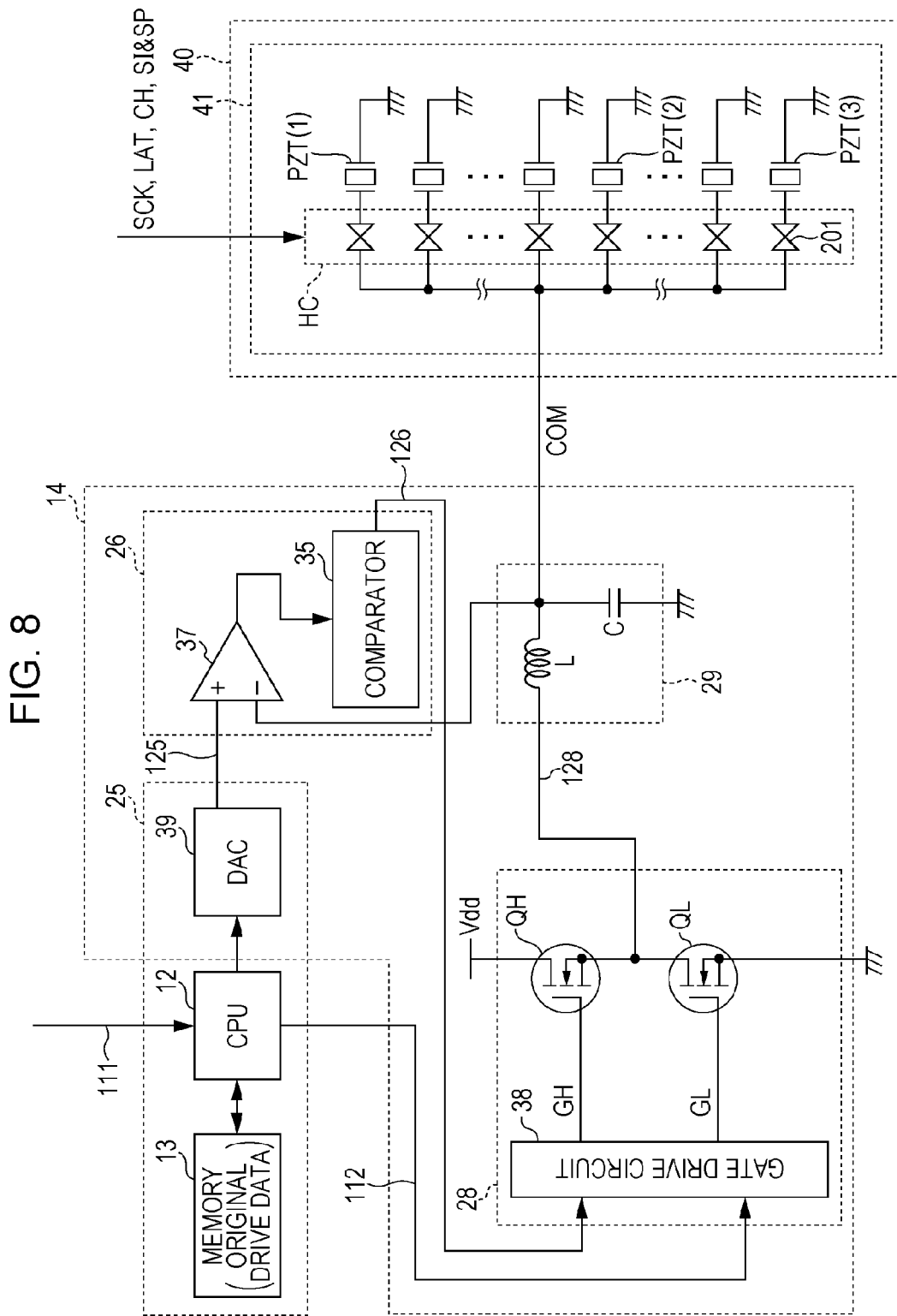

A configuration regarding a functional block illustrated in FIG. 7 will be described in detail. FIG. 8 is a detailed block diagram of the drive signal generation section 14 and the like in the printer 1 the embodiment. The head unit 40 receiving the drive signal COM generated by the drive signal generation section 14 is also illustrated in FIG. 8.

The original drive signal generation section 25 includes the memory 13 which stores the original drive data of the original drive signal 125 configured to have digital potential data and the like, the CPU 12 which reads the original drive data from the memory 13 based on the printing data 111 from the interface section 11, and the DAC 39 which converts a voltage signal output from the CPU 12 into an analog signal to output to the DAC 39 as the original drive signal 125.

The signal modulation section 26 is a circuit generating the modulation signal 126 which has the same basic modulation operation as that of the pulse-density modulation method (hereinafter, PDM method). The signal modulation section 26 includes the error amplifier 37 which amplifies an error, and a comparator 35.

In the PDM method, self-pulsation is performed by comparing an output waveform and an input waveform, thereby modulating the pulse density. Normally, a circuit which realizes a modulation through the PDM method is configured to have an integration circuit, a comparator and a delayer. A basic configuration thereof is the same as that of a generally known $\Delta\Sigma$ modulator. A $\Delta\Sigma$ modulation is one of an A/D conversion quantizing a signal. The $\Delta\Sigma$ modulation causes an error, that is, quantized noise generated in a quantizer (comparator) to be shifted to a higher frequency band than an input signal due to two characteristics such as over sampling and noise shaping, thereby achieving good accuracy with respect to a low band signal, and causing the quantized noise shifted to the high frequency band to be distributed throughout a broadband. Thus, a pulse frequency changes in response to an input signal level.

In the signal modulation section 26 according to the embodiment, a route in which the modulation signal 126 performs feedback via the signal amplification section 28 and the like corresponds to the delayer. The signal modulation section 26 uses the error amplifier 37 which amplifies a differential between two input signals, in place of an integrator which is often used in a modulation circuit adopting the PDM method. In this case, a feedback signal to the signal modulation section 26 is not the amplification modulation signal 128 but the drive signal COM. The quantizing is performed based on the differential between the drive signal COM and the original drive signal 125. The signal modulation section 26 according to the embodiment can reduce delay time (delay element), but for the integrator is not necessary. Thus, it is possible to achieve speed improvement in the modulation process. The signal modulation section 26 can reduce phase delay with respect to the original drive signal 125 of the drive signal COM by correcting phase advance of the error amplifier 37, for example. Since a pulsation frequency rises by decreasing the delay element, the signal modulation section 26 can perform the modulation having high reproducibility of a waveform.

The signal amplification section 28 is the digital power amplification circuit, and is configured to have a half-bridge output stage consisting of a switching element QH on a higher side and a switching element QL on a lower side for amplifying power practically, and a gate drive circuit 38 for adjusting gate input signals GH and GL of the switching element QH on the higher side and the switching element QL on the lower side based on the modulation signal 126 from the signal modulation section 26. For example, a power MOSFET can be used as the switching elements QH and QL, and the switching element is not limited thereto.

In the signal amplification section 28, when the modulation signal 126 is at a high level, a gate input signal GH of the switching element QH on the higher side is at a high level, and a gate input signal GL of the switching element QL on the lower side is at a low level. Therefore, the switching element QH on the higher side is in an ON-state and the switching element QL on the lower side is in an OFF-state. As a result, an output from the half bridge output stage becomes a supply voltage Vdd. On the contrary, when the modulation signal 126 is at a low level, the gate input signal GH of the switching element QH on the higher side is at a low level, and the gate input signal GL of the switching element QL on the lower side is at a high level. Therefore, the switching element QH on the higher side is in the OFF-state and the switching element QL on the lower side is in the ON-state. As a result, an output from the half bridge output stage becomes zero.

When an amplification instruction signal 112 output from the CPU 12 gives an instruction to stop an operation, the gate drive circuit 38 causes both the switching element QH on the higher side and the switching element QL on the lower side to be in the OFF-state. Causing both the switching element QH on the higher side and the switching element QL on the lower side to be in the OFF-state is synonymous with stopping the operation of the signal amplification section 28. Thus, an actuator consisting of the piezoelectric elements PZT which are electrically capacitive loads is maintained in a high impedance state.

The signal conversion section 29 uses a secondary filter which is a smooth filter consisting of a coil L and a capacitor C. A modulation frequency, that is, a frequency component in the pulse modulation generated in the signal modulation section 26 is attenuated and eliminated by the signal conversion section 29, thereby generating the drive signal COM to output to the head unit 40.

The head unit 40 has the heads 41 and includes a number of the piezoelectric elements PZT corresponding to those of the nozzles ejecting a liquid. The first piezoelectric element PZT(1), the second piezoelectric element PZT(2) and the third piezoelectric element PZT(3) are a portion of the overall piezoelectric elements PZT (for example, several thousand piezoelectric elements). The heads 41 include the head control section HC, and the head control section HC includes the selection switch 201 for selecting whether a voltage of the drive signal COM is applied to each of the piezoelectric elements PZT. In FIG. 8, any functional block (for example, shift register 211 and the like, refer to FIG. 6) other than the cavity CA, the nozzles NZ, and the selection switch 201 of the head control section HC is omitted in the illustration.

As described above, the coil L is used for smoothing the amplification modulation signal 128 which is from the signal amplification section 28 (digital power amplification circuit) to generate the drive signal COM. However, generally, generation of heat and a loss in a coil used for smoothing the amplification modulation signal 128 which is from the digital power amplification circuit tend to account for a large portion of overall heat generation and power consumption of the liquid ejecting-type printing apparatus. Accordingly, selection of a coil which can prevent heat generation and heat loss from occurring is a major disadvantage in designing a liquid ejecting-type printing apparatus.

Particularly, in the printer 1, since the amplification modulation signal 128 at a high frequency such as the MHz order is used in order to obtain a printed matter having sufficient quality and resolution, the power consumption greatly varies depending on selection of the coil L. Hereinafter, the method of selecting a coil suitable to be used in the printer 1 will be examined.

4. Regarding Selection of Coil
4.1. Type of Core Material

Generally, a coil can be broadly classified into an air core-type coil in which an electrical wire is wound in a cylindrical shape and the inside of the cylinder is empty, and a core coil in which a winding wire is wound around a core. The core coil often uses ferrite which is a magnetic material, thereby being called a ferrite coil. The loss to the air core-type coil is great despite having a low distortion property, thereby not being suitable to be used in the printer 1. Accordingly, as described below, a plurality of coils having core materials different from each other are evaluated among the ferrite coils to determine the type of the core material suitable for the coil L.

Figure 9:
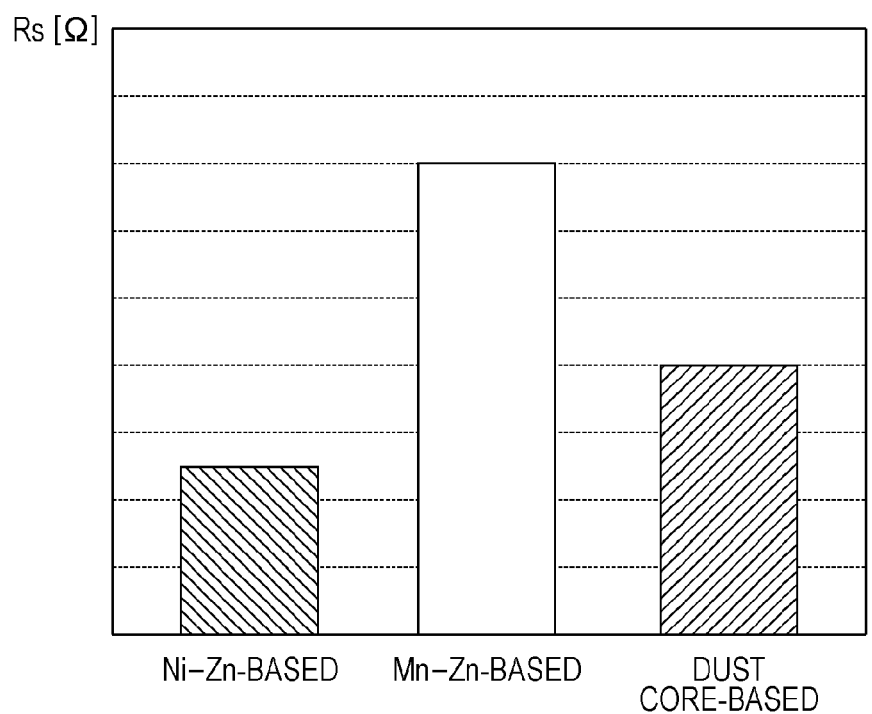
FIG. 9 is a view describing differences of Rs by types of core materials.

Generally, there are three types of the core material such as Mn—Zn-based ferrite (hereinafter, simply referred to as Mn—Zn-based), Ni—Zn-based ferrite (hereinafter, simply referred to as Ni—Zn-based) and dust core-based. Magnetic powder molded by a high pressure press as a core material is used in the dust core-based. FIG. 9 is measurement of Rs in coils respectively using the three types of the core materials, and illustrates differences of the Rs by the types of the core materials. The Rs is a resistance component of the coil, and includes a resistance component contributing to an iron loss (loss of core) and a resistance component contributing to a copper loss (loss of wire material). In the following, "a resistance component contributing to an iron loss (loss of core)" may be simply referred to as "the iron loss (loss of core)", and "a resistance component contributing to a copper loss (loss of wire material)" may be simply referred to as "the copper loss (loss of wire material)". Direct current resistance (for example, approximately 2 mΩ) of a coil, is also a resistance component. However, the direct current resistance may be excluded from subjects of the examination for being too small (for example, two-digit) compared to the Rs.

As in FIG. 9, the coil using the Mn—Zn-based core material (hereinafter, also simply referred to as Mn—Zn-based coil) has a greater Rs value than the coil using the Ni—Zn-based core material (hereinafter, also simply referred to as Ni—Zn-based coil) and the coil using the dust core-based core material (hereinafter, also simply referred to as dust core-based coil). Although details will be described below, since an eddy-current loss can be reduced when the Rs is great, it is preferable to select the Mn—Zn-based coil as the coil L.

As another characteristic of the types of the core materials, the Ni—Zn-based coil can be exemplified for being low in saturation magnetic flux density, which denotes that the number of turn thereof needs to be increased, for example, compared to the coils of other types in order to obtain a desired inductance value. However, since a small-type coil L is used in the printer 1, it is difficult to greatly increase the number of turn. Therefore, from a viewpoint of the saturation magnetic flux density, it is difficult to say that the Ni—Zn-based coil is suitable for the coil L of the printer 1. When comparing the Mn—Zn-based coil and the dust core-based coil, the dust core-based coil generally tends to be relatively high in the eddy-current loss. For this reason, it is preferable to select the Mn—Zn-based coil unless the dust core-based coil is usable in which the eddy-current loss is sufficiently prevented.

The Rs values in FIG. 9 are evaluation results when a 4 MHz-operation, that is, a pulse signal at a frequency of 4 MHz is applied to each of the Mn—Zn-based coil, the Ni—Zn-based coil and the dust core-based coil. The frequency band of an AC component in the amplification modulation signal 128 is in a range of equal to or higher than 1 MHz and lower than 8 MHz. However, the fact remains that the Rs value of the Mn—Zn-based coil is relatively high in this frequency band.

The frequency band of the AC component in the amplification modulation signal 128 is equal to or higher than 1 MHz for the following reason. COMA in FIG. 15 indicates a result of a frequency spectrum analysis regarding a pulse waveform (for example, a waveform of a portion of the original drive signal 125 corresponding to PCOM 2 in FIG. 5) in the original drive signal 125. According to FIG. 15, it is known that a frequency in a range of approximately 10 kHz to 400 kHz is included. In order to obtain the drive signal COM by amplifying the signal amplification section 28 which is the digital power amplification circuit, it is necessary for the signal amplification section 28 to be driven at a switching frequency equal to or higher than ten times that of the frequency component included in the original drive signal 125 at the minimum. If the switching frequency of the signal amplification section 28 is lower than ten times as much compared to the frequency spectrum included in the original drive signal 125, it is not possible to modulate and amplify a high frequency spectrum component included in the original drive signal 125, thereby causing the sharpness (edge) of the drive signal COM to become obtuse and rounded. If the drive signal COM becomes obtuse, movements of the piezoelectric element PZT which is operated in accordance with the rising edge/falling edge of the waveform become dull, and thus, there is a possibility that an ejecting amount from the nozzle NZ may be unstable or ejection failure may occur. In other words, there is a possibility of an occurrence of an unstable drive. According to FIG. 15, the high frequency spectrum component of the pulse waveform in the original drive signal 125 has the peak at approximately 60 kHz, and many components have frequencies of lower than 100 kHz. For this reason, it is desirable to drive the signal amplification section 28 at the switching frequency to the extent of 1 MHz which is ten times of 100 kHz, at the minimum.

Figure 15:
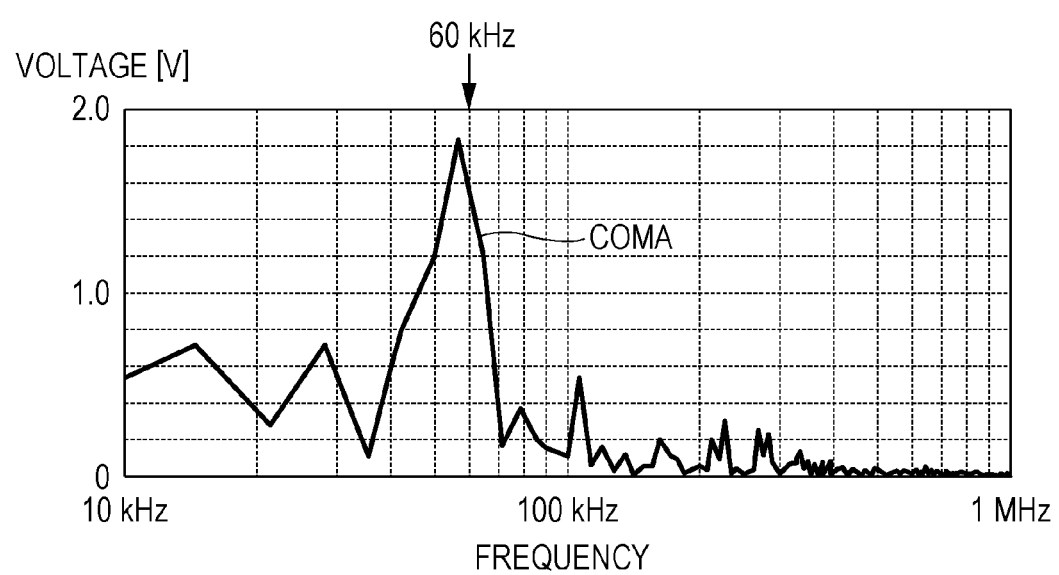
FIG. 15 is a spectrum analysis diagram of an original drive signal.

The frequency component included in the original drive signal 125 varies depending on a size of an ejected ink droplet or a waveform of the original drive signal 125 corresponding to a size of printing dots. For example, a waveform of a portion of the original drive signal 125 used in the spectrum analysis in FIG. 15 is an original drive signal 125 for ejecting an ink droplet having a size smaller than a standard size, and thus, a vibration width is small, at approximately 2V, as illustrated in FIG. 15. In this manner, in order to eject the ink droplet having a small size, the piezoelectric element PZT is caused to rapidly move so that a small ink droplet is ejected. Therefore, the drive signal COM needs to include many high frequency spectrum components, and the piezoelectric element PZT needs to move at a high speed as a matter of circumstances in order to perform high-speed printing, and many high frequency spectrum components need to be included. In other words, as a higher speed and higher resolution are pursued in printing, a demanded minimum frequency tends to be higher. The drive signal COM in the embodiment is designed for general household/office use, and is designed in expectation of printing approximately five sheets of an A4 printed matter per minute to the specification of 5,760×1,440 dpi, using 180 piezoelectric elements PZT.

The frequency band of the AC component of the amplification modulation signal 128 is lower than 8 MHz, for the following reason. When the switching frequency is high, if switching is attempted at a high pressure and a high frequency so as to be able to drive the piezoelectric element PZT, various disadvantages occur such as generation of noise caused by increased junction capacitance, and an increase of a switching loss due to high frequency drive, for a structural reason of a switching transistor (QH, QL). Particularly, the increase of the switching loss may become a significant disadvantage. In other words, the increase of the switching loss may result in impairment of a power saving property and a low pyrogenic property in which the digital power amplification circuit (digital amplifier) is relatively advantageous compared to an amplifier of class AB.

In the embodiment, when compared to an analog amplifier (amplifier of class AB) hitherto used, a result is obtained in which the digital amplifier is advantageous over the analog amplifier up to 8 MHz. However, when the transistor is driven at a frequency equal to or higher than 8 MHz, the amplifier of class AB may be advantageous over the digital amplifier.

Figure 10:
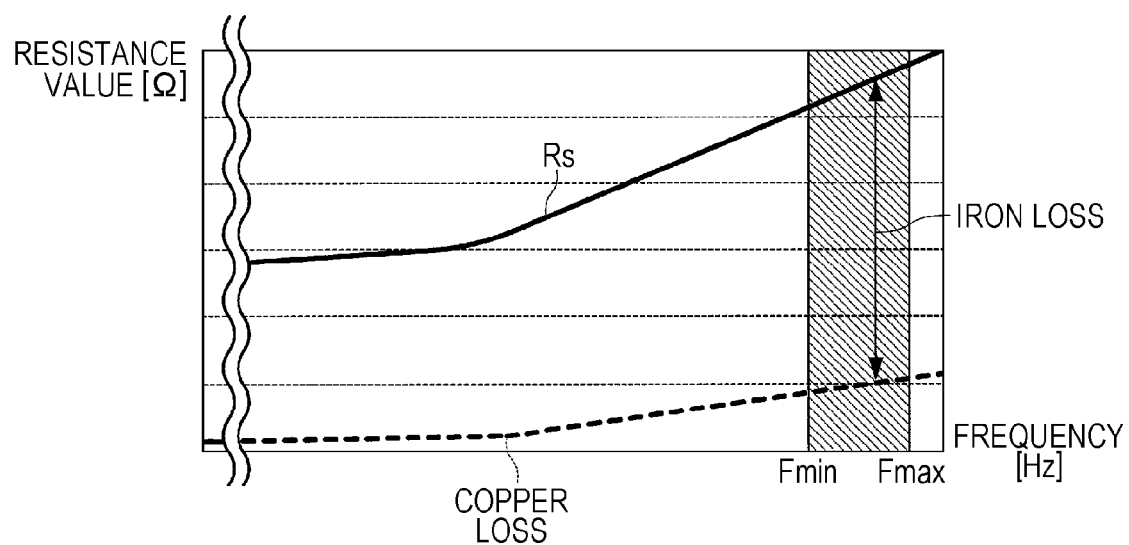
FIG. 10 is a view describing a ratio of a copper loss to an iron loss in Rs.

Hereinafter, it is preferable to select the Mn—Zn-based coil having great Rs among the three types described above, and the reason will be described with reference to FIGS. 10 to 11B. FIG. 10 is a view describing a ratio of the copper loss to the iron loss in Rs. The vertical axis (resistance value) in FIG. 10 uses a logarithmic scale.

As described above, the Rs is a resistance component of the coil including the iron loss and the copper loss. The Rs described in a solid line in FIG. 10 is based on data measured by an impedance analyzer. The amplification modulation signal 128 input to the coil L of the printer 1 can secure a frequency within a range from Fmin to Fmax in FIG. 10, during a normal operation of printing performed by the printer 1. In other words, in the embodiment, the Fmin is 1 MHz and the Fmax is approximately 8 MHz.

An electrical resistance Rc of the copper loss among the Rs can be calculated through Expression 1, using an electrical resistivity ρ, a length L of a conductor, and a cross-sectional area $S_0$ of the conductor.

$$R_c = \frac{\rho L}{S_0} \quad (1)$$

The copper loss described in a dotted line in FIG. 10 indicates the Rc of Expression 1. Accordingly, in FIG. 10, a difference between the Rs in the solid line and the copper loss in the dotted line denotes the iron loss. Since the vertical axis (resistance value) is the logarithmic scale, there is a relationship of iron loss>>copper loss within a frequency range from Fmin to Fmax, and thus, the iron loss is dominant in a loss of the coil L of the printer 1.

The iron loss (W) is the sum total of a hysteresis loss ($W_h$) and the eddy-current loss ($W_e$), and can be described as Expression 2 below.

$$W = W_h + W_e \approx (K_h \times B_m^{\eta_1} \times f) + (K_{e1} \times B_m^{\eta_2} \times f^2) \quad (2)$$

In Expression 2, the reference sign $B_m$ denotes magnetic flux density; each of the reference signs/numerals $K_h$, $K_{e1}$, $\eta_1$ and $\eta_2$ denote fixed numbers; the reference sign f denotes a frequency of a signal of the coil L. The hysteresis loss ($W_h$) is a loss occurring when a direction of a magnetic field in a core varies. Since the hysteresis loss ($W_h$) occurs in proportion to the number of magnetic variation, the hysteresis loss ($W_h$) is proportional to the frequency (f). Meanwhile, the eddy-current loss ($W_e$) is a loss occurring due to generation of an electromotive force through electromagnetic induction in accordance with variations of the magnetic field in the core, and is due to an induced current flowing the core. Volume of the eddy-current flowing the core is in proportion to a magnetic variation speed, that is, the frequency (f). Since the frequency (the number of occurrence) is multiplied by the volume thereof, the eddy-current loss is in proportion to the square of the frequency (f).

Figure 11A:
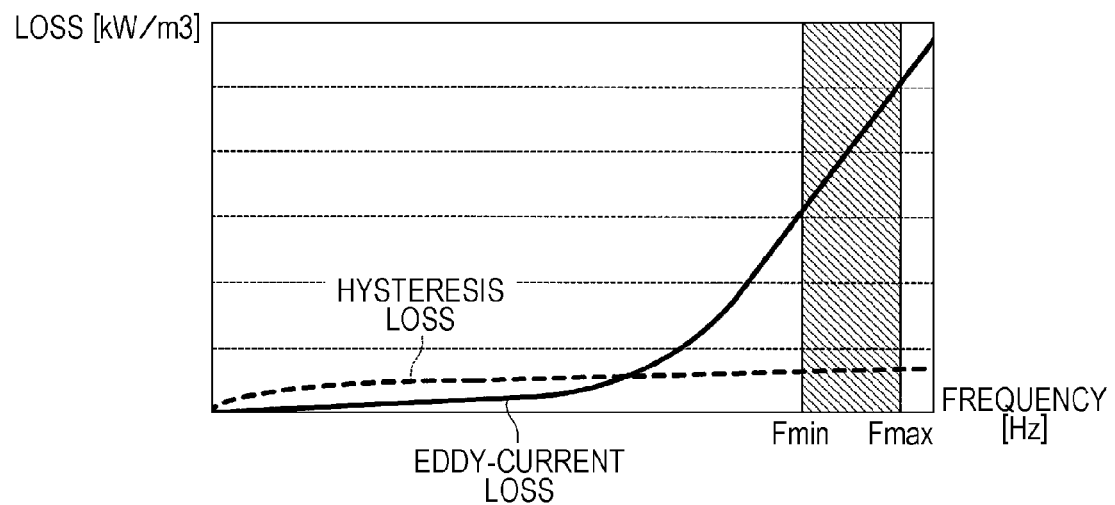
FIG. 11A is a view describing a ratio of an eddy-current loss to a hysteresis loss.

FIG. 11A is a view describing a ratio of the eddy-current loss to the hysteresis loss, and is based on the above-described Expression 2. The printer 1 adopts the amplification modulation signal 128 used within a range of the high frequency (Fmin to Fmax). Therefore, as illustrated in FIG. 11A, the eddy-current loss is dominant which is in proportion to the square of the frequency (f) in the same range, and most of the iron loss can be regarded as the eddy-current loss.

Figure 11B:
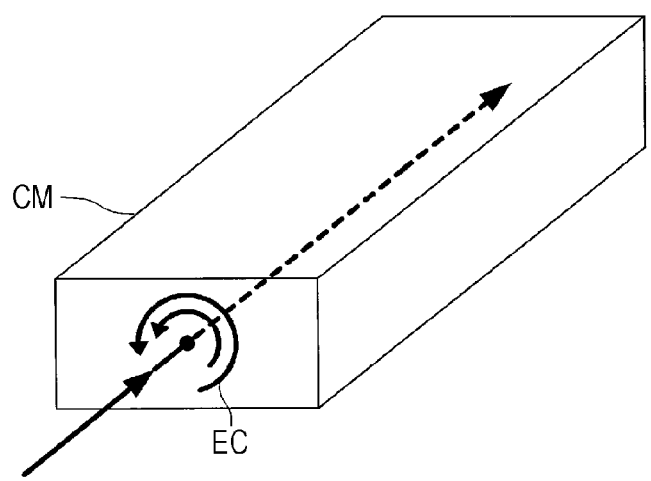
FIG. 11B is a view for describing an eddy-current.

FIG. 11B is a view for describing an eddy-current EC. The eddy-current EC is generated by the generation of the electromotive force through the electromagnetic induction in accordance with the variations of the magnetic field (dotted line in FIG. 11B) inside the core CM. In order to prevent the eddy-current loss, it is necessary to reduce an eddy-current, that is, to select a material having great electrical resistance for the core CM. Accordingly, the Mn—Zn-based coil is selected having great Rs which is the resistance component, among the Mn—Zn-based coil, the Ni—Zn-based coil, and the dust core-based coil so as to be able to prevent the eddy-current loss. As described above, the iron loss rather than the copper loss, and then, the eddy-current loss among the iron losses is dominant in the printer 1 adopting the amplification modulation signal 128 used in the range of the high frequency. Therefore, the most dominant eddy-current loss can be prevented by selecting the Mn—Zn-based coil as the coil L, and thus, it is possible to prevent heat generation and a loss of the coil L and provide the printer 1 of low power consumption.

4.2. Selection of Coil 4.2.1. Selection Criterion

Figure 12A:
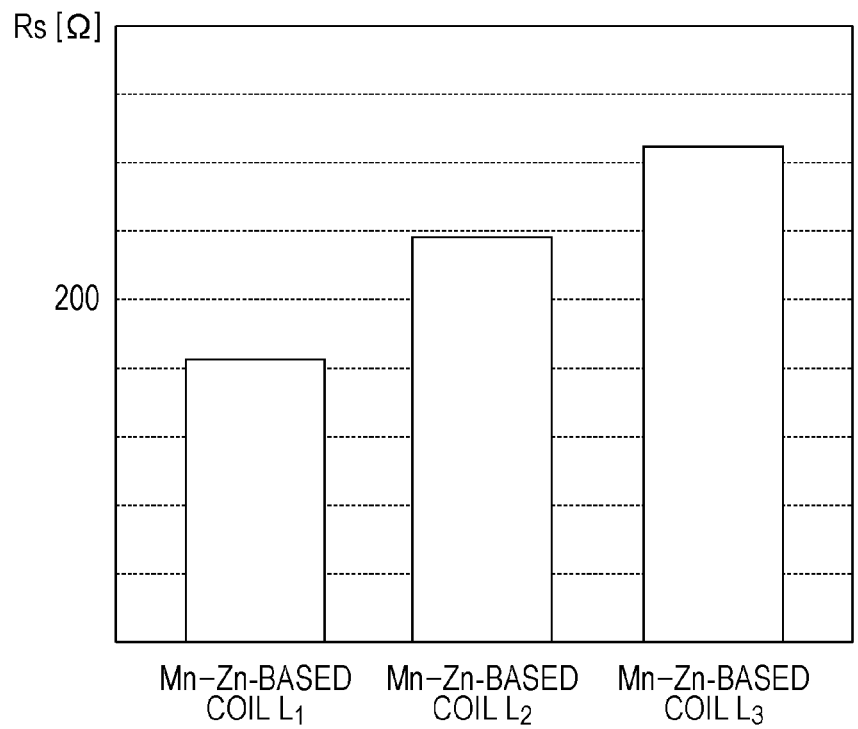
FIGS. 12A and 12B are views for describing an interrelationship between Rs of a coil using the core material formed of Mn—Zn-based ferrite and power consumption.

The coil L of the printer 1 configures a filter for smoothing the amplification modulation signal 128. However, generally, there is a range of choice. For example, as illustrated in FIG. 12A, when there are coils $L_1$, $L_2$ and $L_3$, all of which are the Mn—Zn-based coil and all of which are able to satisfy a desired characteristic for the filter, it is preferable to have a criterion to show which coil is the most suitable. In the following, a selection criterion other than the type of the core material will be examined.

Figure 12B:
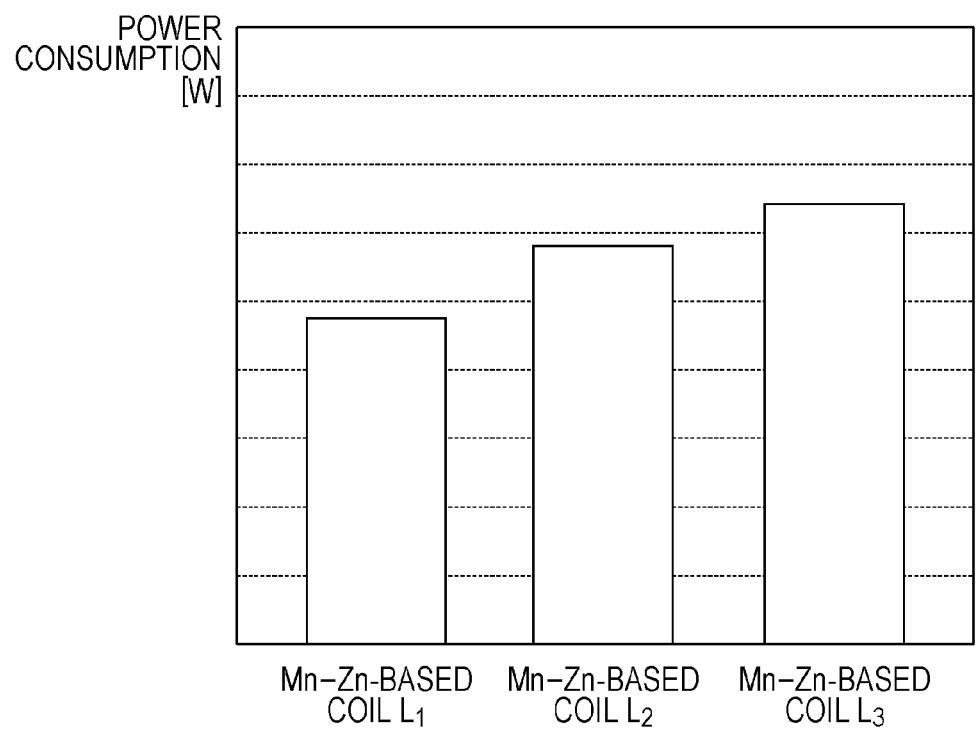

FIGS. 12A and 12B are views for describing an interrelationship between the Rs of the Mn—Zn-based coil and power consumption. FIG. 12A illustrates a result of each measured Rs of three coils $L_1$, $L_2$ and $L_3$ which are the Mn—Zn-based coils. As illustrated in FIG. 12A, each Rs becomes higher in the coils in the proceeding order $L_1$, $L_2$ and $L_3$. As illustrated in FIG. 12B, each of the power consumptions becomes higher in the coils in the proceeding order $L_1$, $L_2$ and $L_3$. In other words, according to a result obtained from an experiment regarding the Mn—Zn-based coil, the resistance component Rs and the power consumption have a positive interrelationship.

Both FIGS. 12A and 12B illustrate measurement values during the 4 MHz-operation, and the above-described interrelationship remains unchanged in an operation within the range of Fmin to Fmax. According to the result of tests carried out with more samples, heat generation and a loss are reduced when a coil having the Rs lower than 200 mΩ is selected in the 4 MHz-operation, thereby obtaining a good result.

Therefore, regarding the Mn—Zn-based coil, it is possible to select a suitable coil by having a selection criterion of the Rs to be lower than 200 mΩ. In order to comply with the selection criterion, it is preferable to select the coil $L_1$ having the Rs lower than 200 mΩ as in FIG. 12A, among the coils $L_1$, $L_2$ and $L_3$.

4.2.2. Adjustment Method

Subsequently, a case when there is no coil satisfying the selection criterion will be examined. For example, it is considered that there is no coil like the coil $L_1$ but the coil $L_2$ which can adjust the number of turn and a core gap CG is available.

As described above, there is a relationship of iron loss>>copper loss within the frequency range of Fmin to Fmax, and thus, the eddy-current loss is dominant as the iron loss. In Expression 2, the constant η2 is "2", and the eddy-current loss $W_e$ is proportional to the square of the magnetic flux density $B_m$, to be specific. Therefore, it is effective to lower the magnetic flux density $B_m$ in order to lower the eddy-current loss $W_e$.

Magnetic flux ϕ, the magnetic flux density $B_m$, an inductance value $V_L$ are respectively described in Expressions 3, 4 and 5 as follows.

$$\Phi = \frac{V_L \times I}{N} \quad (3)$$

$$B_m = \frac{\Phi}{S_1} \quad (4)$$

$$V_L = k \times \mu_e \times N^2 \quad (5)$$

In Expressions 3 to 5, the reference sign I denotes a current flowing the coil, the reference sign N denotes the number of turn, the reference sign $S_1$ denotes a cross-sectional area of the core, the reference sign k denotes a constant of proportionality determined by a shape of the coil, and the reference sign $\mu_e$ denotes effective permeability. According to Expressions 3 to 5, it is possible to lower the magnetic flux density $B_m$, by adjusting the coil as described below.

Initially, the magnetic flux density $B_m$ can be lowered by lowering the inductance value $V_L$ or the current I flowing the coil. However, since the inductance value $V_L$ and the current I flowing the coil are in a relationship inversely proportional to each other, when one thereof changes, the other offsets the change, thereby being less effective in lowering the magnetic flux density $B_m$.

The magnetic flux density $B_m$ can be lowered by increasing the cross-sectional area $S_1$ of the core. However, it is not practical due to many constraints on design such as an increase of an area for mounting the coil, and degradation of flexibility in design of a coil.

Therefore, it is considerable to adopt an adjustment method for lowering the magnetic flux density $B_m$ by lowering the effective permeability $\mu_e$. The effective permeability $\mu_e$ varies in accordance with a change in the core gap CG of the coil, for example.

Figure 13A:
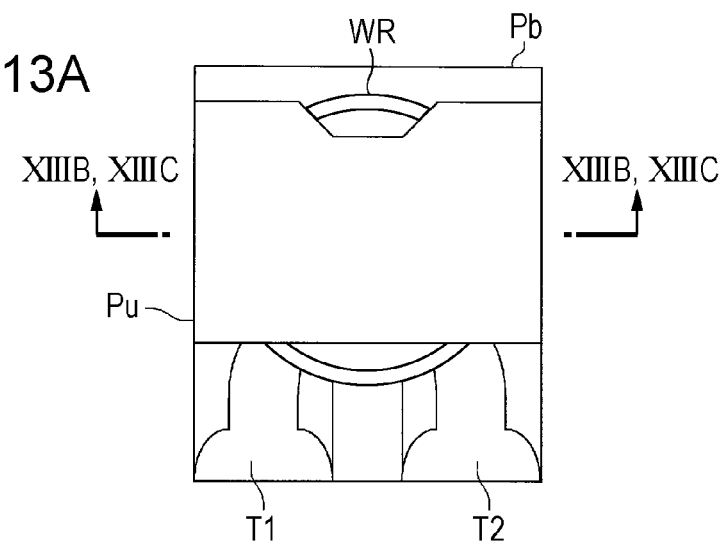
FIG. 13A is a plan view illustrating the appearance of the coil.
Figure 13B:
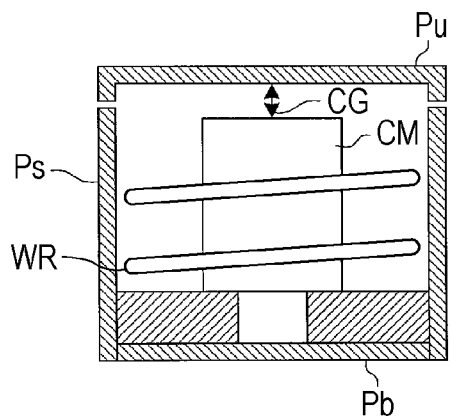
FIGS. 13B and 13C are cross-sectional views taken along line XIIIB, XIIIC-XIIIB, XIIIC for describing a core gap and the number of turn of the coil.

FIG. 13A is a plan view illustrating the appearance of the coil (corresponding to coil $L_2$), and FIG. 13B is a cross-sectional view taken along line XIIIB-XIIIB thereof. As illustrated in FIGS. 13A and 13B, the coil main body in which a wire material is wound around the core CM is configured to be surrounded by an upper package Pu, a side package Ps and a bottom package Pb. Terminals T1 and T2 are respectively connected to both ends of the wire material of the coil. As illustrated in FIG. 13B, a gap between the core CM and the upper package Pu is the core gap CG.

Figure 13C:
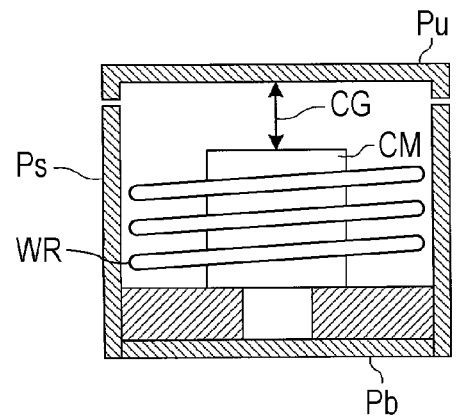

FIG. 13C is a cross-sectional view taken along line XIIIC-XIIIC describing a case when the core gap CG is widened. In this case, the effective permeability $\mu_e$ is lowered when the core gap CG is widened, and the magnetic flux density Bm is lowered as well.

However, as shown in Expression 5, an increase in the number of turn N causes the inductance value $V_L$ to change. There is a possibility that characteristics of a smoothing filter may vary when the inductance value $V_L$ changes. Therefore, it is preferable to perform an adjustment by increasing the number of turn N and maintaining the inductance value $V_L$ at the same time. In FIG. 13C, compared to a state of FIG. 13B, the adjustment is performed by widening the core gap CG and increasing the number of turn from two turns to three turns so as to maintain the inductance value $V_L$.

Figure 14:
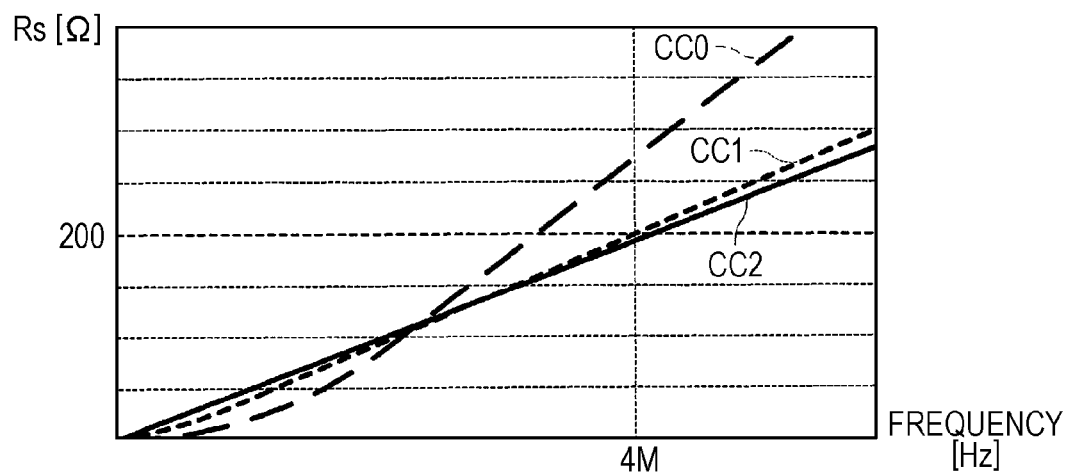
FIG. 14 is a view exemplifying a change of a frequency-Rs characteristic depending on a difference in the core gap and the number of turn of the coil.

FIG. 14 is a view exemplifying a change of frequency-Rs characteristics due to a difference in the core gap CG and the number of turn of the coil. A characteristic curve CC0 indicated by a dotted line describes characteristics of the coil (corresponding to coil $L_2$) before adjusting the core gap CG and the number of turn. In this case, the Rs of the coil does not satisfy the selection criterion, that is, being lower than 200 mΩ in the 4 MHz-operation.

A characteristic curve CC2 indicated by a solid line in FIG. 14 describes characteristics of a case in which the core gap CG is broadened to 1.1 mm. In this case, the Rs falls below 200 mΩ in the 4 MHz-operation, in accordance with a decrease of the magnetic flux density $B_m$. However, since the inductance value $V_L$ also decreases, it is necessary to perform the adjustment so as to maintain the inductance value $V_L$ to be the same as that before the core gap CG is broadened.

A characteristic curve CC1 indicated by a small dotted line in FIG. 14 describes characteristics of a case when the number of turn is increased to three turns and the inductance value $V_L$ is maintained to be the same as that before the core gap CG is broadened. In this case as well, the Rs falls below 200 mΩ in the 4 MHz-operation, and thus, heat generation and a loss in the coil can be sufficiently reduced.

As described above, even though the coil does not satisfy the selection criterion, the Rs can be sufficiently lowered by performing the adjustment, that is, widening the core gap CG equal to or wider than 1.1 mm. It is possible to perform the adjustment for maintaining the inductance value $V_L$ by increasing the number of turn to be equal to or greater than three turns. Even though this adjustment is performed, the Rs can be maintained in a sufficiently low (lower than 200 mΩ) state. In other words, according to the above-described adjustment method, the Rs can be sufficiently lowered without influencing the characteristics of the smoothing filter.

In the embodiment, the adjustment method is described on the premise that the Mn—Zn-based coil is used. However, the adjustment method can be applied to a coil (for example, Ni—Zn-based coil) of a different type, without being limited to the Mn—Zn-based coil. Expressions 3 to 5 do not depend on the type of the coil, and the adjustment method is deduced from the examinations based on Expressions 3 to 5, and thus, the adjustment method can be applied to a coil of a different type, without being limited to the Mn—Zn-based coil.

As described above, in a liquid ejecting-type printing apparatus such as the printer 1 in which the amplification modulation signal 128 at a high frequency is used, it is possible to select a coil having high conversion efficiency so as to be able to prevent heat generation and a loss when smoothing the amplification modulation signal 128. Initially, the Mn—Zn-based coil is selected, and thus, it is possible to prevent the eddy-current loss from accounting for a large portion of the iron loss and to reduce heat generation and a loss thereof. The selection criterion in which the Rs during the 4 MHz-operation is lower than 200 mΩ adopted, and thus, it is possible to select a coil having less heat generation and a loss based on the interrelationship between the Rs and power consumption. An adjustment is performed widening the core gap CG equal to or wider than 1.1 mm, or a coil satisfying such a condition is selected, and thus, it is possible to prevent the eddy-current loss from accounting for a large portion of the iron loss and to reduce heat generation and a loss. In this case, an adjustment is performed by increasing the number of turn to be equal to or greater than three turns, or a coil satisfying such a condition is selected so that the inductance value can be maintained without influencing characteristics of the filter. Thus, it is possible to provide a liquid ejecting-type printing apparatus of low power consumption, and the like by using such a coil.

The embodiment is not limited to the liquid ejecting apparatus by a line head method (for example, may be also applied to a liquid ejecting apparatus by a serial head method), and thus, the same effect can be achieved as long as the amplification modulation signal 128 can be adopted in a liquid ejecting-type printing apparatus.

5. Others

The aspects of the invention include substantially the same configuration (for example, a configuration having the same function, method and result; or a configuration having the same goal and effect) as the configuration described in the examples and applications. The aspects of the invention also include a configuration of which a portion that is nonessential in the configuration described in the embodiments and the like is replaced. The aspects of the invention further include a configuration exhibiting the same operation effect or a configuration through which the same goal can be achieved, as the configuration described in the embodiments and the like. The aspects of the invention also include a configuration in which a known technology is added to the configuration described in the embodiments and the like.

What is claimed is:

1. A liquid ejecting apparatus comprising:
    a signal modulation section that causes an original drive signal to be pulse-modulated to generate a modulation signal;
    a signal amplification section that amplifies the modulation signal to generate an amplification modulation signal;
    a coil that smoothes the amplification modulation signal to generate a drive signal, wherein the coil is wound around a core, and the coil and core are surrounded by a package;
    a piezoelectric element that deforms when the drive signal is applied thereto;
    a cavity that expands or contracts due to a deformation of the piezoelectric element; and
    a nozzle that communicates with the cavity and ejects a liquid in accordance with an increase/decrease of a pressure inside the cavity, wherein:
    the core is a ferrite core,
    a core gap is defined between the core and the package,
    a number of turns of the coil around the core is based on the core gap such that as the core gap increases, the number of turns increases, and
    the coil has a resistance component that includes a core material loss and a wire material loss, and the resistance component of the coil is lower than 200 mΩ at a 4 MHz operation.

2. The liquid ejecting apparatus according to claim 1, wherein the coil has a number of turns equal to or greater than three.

3. The liquid ejecting apparatus according to claim 1, wherein a frequency band of an AC component of the amplification modulation signal is equal to or higher than 1 MHz.

4. The liquid ejecting apparatus according to claim 1, wherein a frequency band of an AC component of the amplification modulation signal is lower than 8 MHz.

5. The liquid ejecting apparatus according to claim 1, wherein the core material loss is greater than the wire material loss in the coil during a normal operation.

6. The liquid ejecting apparatus according to claim 1, wherein the core is formed of a Mn—Zn-based ferrite.

7. The liquid ejecting apparatus according to claim 1, wherein the core gap is equal to or wider than 1.1 mm.

* * * * *